(12) United States Patent
Poultney

(10) Patent No.: US 7,595,931 B2
(45) Date of Patent: Sep. 29, 2009

(54) GRATING FOR EUV LITHOGRAPHIC SYSTEM ABERRATION MEASUREMENT

(75) Inventor: Sherman K. Poultney, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 637 days.

(21) Appl. No.: 11/037,178

(22) Filed: Jan. 19, 2005

(65) Prior Publication Data

US 2005/0146700 A1    Jul. 7, 2005

Related U.S. Application Data

(62) Division of application No. 10/753,557, filed on Jan. 9, 2004, now Pat. No. 6,867,846.

(60) Provisional application No. 60/440,051, filed on Jan. 15, 2003.

(51) Int. Cl.
G06K 7/10 (2006.01)
G02B 5/18 (2006.01)

(52) U.S. Cl. .................. 359/572; 359/350; 359/573; 359/576

(58) Field of Classification Search .......... 359/558, 359/486
See application file for complete search history.

(56) References Cited

U.S. PATENT DOCUMENTS

| | | | |
|---|---|---|---|
| 4,413,909 A | 11/1983 | Pohle | .................. 356/521 |
| 4,490,608 A | 12/1984 | Yeadon et al. | |
| 4,518,854 A | 5/1985 | Hutchin | |
| 4,703,434 A | 10/1987 | Brunner | |
| 4,707,137 A | 11/1987 | Lee | |
| 5,062,705 A | 11/1991 | Sato et al. | |
| 5,222,050 A | 6/1993 | Marren et al. | |
| 5,333,050 A | 7/1994 | Nose et al. | .................. 356/490 |
| 5,424,552 A | 6/1995 | Tsuji et al. | |
| 5,486,950 A | 1/1996 | Collinge | |
| 5,641,593 A | 6/1997 | Watanabe et al. | |
| 5,715,039 A | 2/1998 | Fukuda et al. | |
| 5,835,217 A | 11/1998 | Medecki | |
| 5,958,629 A | 9/1999 | Yan et al. | |

(Continued)

FOREIGN PATENT DOCUMENTS

EP    0 247 665 A1    12/1987

(Continued)

OTHER PUBLICATIONS

Bjorkholm, J. E., "EUV Lithography—The Successor to Optical Lithography?", Intel Technology Journal Q3'98, 1998, pp. 1-8.

(Continued)

Primary Examiner—Stephone B Allen
Assistant Examiner—Jade R Callaway
(74) Attorney, Agent, or Firm—Sterne, Kessler, Goldstein & Fox P.L.L.C

(57) ABSTRACT

A grating includes an absorptive substrate and a plurality of reflective lines on the absorptive substrate. Each reflective line is formed by a plurality of reflective areas. The reflective areas can be arranged in a regular pattern. The reflective areas are between 70 nm and 120 nm in diameter. The reflective areas can be circular. The reflective areas can have a random height distribution.

20 Claims, 14 Drawing Sheets

U.S. PATENT DOCUMENTS

| | | | |
|---|---|---|---|
| 6,057,082 A | 5/2000 | Korth | |
| 6,072,631 A | 6/2000 | Guenther et al. | |
| 6,118,516 A | 9/2000 | Irie et al. | |
| 6,163,405 A | 12/2000 | Chang et al. | |
| 6,262,845 B1 | 7/2001 | Sweatt | |
| 6,266,147 B1 | 7/2001 | Naulleau | |
| 6,312,373 B1 | 11/2001 | Ichihara | |
| 6,360,012 B1 | 3/2002 | Kreuzer | 382/211 |
| 6,373,553 B1 | 4/2002 | Singh | 355/55 |
| 6,392,792 B1 | 5/2002 | Naulleau | |
| 6,456,382 B2 | 9/2002 | Ichihara et al. | |
| 6,498,685 B1 | 12/2002 | Johnson | |
| 6,506,526 B2 | 1/2003 | Stivers et al. | |
| 6,573,997 B1 | 6/2003 | Goldberg et al. | |
| 6,650,399 B2 | 11/2003 | Baselmans et al. | 355/55 |
| 6,665,119 B1* | 12/2003 | Kurtz et al. | 359/486 |
| 6,686,098 B2 | 2/2004 | Czech et al. | |
| 6,813,077 B2* | 11/2004 | Borrelli et al. | 359/486 |
| 6,861,273 B2* | 3/2005 | Anderson et al. | 438/30 |
| 6,867,846 B2 | 3/2005 | Poultney | |
| 6,898,216 B1 | 5/2005 | Kleinschmidt | |
| 7,002,747 B2 | 2/2006 | Augustyn et al. | |
| 7,027,164 B2 | 4/2006 | Gontin et al. | |
| 7,164,534 B2 | 1/2007 | Augustyn et al. | |
| 7,268,891 B2 | 9/2007 | Poultney | |
| 7,411,687 B2 | 8/2008 | Gontin et al. | |
| 2001/0028462 A1 | 10/2001 | Ichihara et al. | |
| 2001/0051304 A1 | 12/2001 | Stivers et al. | |
| 2002/0001088 A1 | 1/2002 | Wegmann et al. | |
| 2002/0122162 A1 | 9/2002 | Nakauchi et al. | |
| 2002/0145717 A1 | 10/2002 | Baselmans et al. | |
| 2002/0186469 A1* | 12/2002 | Kawazu et al. | 359/486 |
| 2003/0081316 A1 | 5/2003 | Goldberg et al. | |
| 2004/0125449 A1* | 7/2004 | Sales | 359/486 |
| 2007/0153295 A1 | 7/2007 | Poultney | |

FOREIGN PATENT DOCUMENTS

| | | |
|---|---|---|
| EP | 0 418 054 A2 | 3/1991 |
| EP | 0 534 720 A1 | 3/1993 |
| EP | 1 106 972 A1 | 6/2001 |
| EP | 1 197 803 A2 | 4/2002 |
| EP | 1 197 803 A3 | 4/2002 |
| EP | 1 231 514 A1 | 8/2002 |
| EP | 1 231 517 A1 | 8/2002 |
| EP | 1 237 041 A2 | 9/2002 |
| EP | 1 237 041 A3 | 9/2002 |
| EP | 1 256 843 A1 | 11/2002 |
| EP | 1 310 806 A1 | 5/2003 |
| EP | 1439 426 A2 | 7/2004 |
| JP | 58-016216 A | 1/1983 |
| JP | 3-134538 A | 6/1991 |
| JP | 7-240367 A | 9/1995 |
| JP | 2000-266914 | 9/2000 |
| JP | 2001-60550 A | 3/2001 |
| JP | 2002055226 A * | 2/2002 |
| JP | 2002-334831 A | 11/2002 |
| WO | WO 01/63233 A2 | 8/2001 |
| WO | WO 02/42728 A1 | 5/2002 |
| WO | WO 2004/057423 A1 | 7/2004 |

OTHER PUBLICATIONS

Goldberg, K.A., et al., "Extreme ultraviolet interferometry: at-wavelength testing of optics for lithography," The Advanced Light Source, 1998, at http://www-als.lbl.gov/als/compendium/AbstractManager/uploads/ACF4B6D.pdf, 4 pages.

Goldberg, K.A., et al., "Extreme ultraviolet interferometry: measuring EUV optical systems with sub-Å accuracy," The Advanced Light Source, 2001, at http://www-als.lbl.gov/als/compendium/AbstractManager/uploads/01125.pdf, 3 pages.

Kolb, R., "EUV Lithography Making Possible Next Generation of Semiconductors," Sciencebeat [online], Jun. 5, 2001, at http://www.lbl.gov/Science-Articles/Archive/euv_milestone.html (visited Jan. 12, 2003), 4 pages.

Lee, S. H., *High Accuracy EUV Interferometry*, at http://buffy.eecs.berkeley.edu/IRO/Summary/99abstracts/shlee.1.html (visited Jan. 12, 2003), 1 page.

Mansuripur, M., "The Ronchi Test," MM Research, Inc., at http://www.mmresearch.com/articles/article1 (visited Jan. 9, 2003), 12 pages (also published in *Optics & Photonics News*, Jul. 1997, pp. 42-46).

*Measurement Science in the Extreme Ultraviolet: Testing Advance Optics for Printing Integrated Circuits*, at http://www.als.lbl.gov/als/actrep/FileH.pdf (visited Jan. 12, 2003), 2 pages.

Naulleau, P. P., et al., "Fabrication of high-efficiency multilayer-coated binary blazed gratings in the EUV regime," *Optics Communications*, vol. 200, Dec. 15, 2001, Elsevier Science B.V., pp. 27-34.

Wyant, J. C., "White Light Extended Source Shearing Interferometer," *Applied Optics*, vol. 13, No. 1, Jan. 1974, pp. 200-202.

English-language abstract for Japanese Patent Application No. 2000-266914, published Sep. 29, 2000, from www.espacenet.com, 1 page.

English Translation of the *Notice of Reasons for Rejection*, from Japanese Patent Appl. No. 2005-507696, 4 pages, mailed Dec. 6, 2007.

English abstract of Japanese Patent Publication No. JP 3-134538 A, 1 page.

English abstract of Japanese Patent Publication No. JP 7-240367 A, 1 page.

English abstract of Japanese Patent Publication No. JP 2002-334831 A, 1 page.

English Translation of the *Notice of Reasons for Rejection*, from Japanese Patent Appl. No. 2005-507696, 4 pages, mailed Dec. 6, 2007.

English abstract of Japanese Patent Publication No. JP 3-134538 A, 1 page, Jun. 7, 1991.

English abstract of Japanese Patent Publication No. JP 7-240367 A, 1 page, Sep. 12, 1995.

English abstract of Japanese Patent Publication No. JP 2002-334831 A, 1 page, Nov. 22, 2002.

Search Report from the European Patent Office for European Patent Application No. 04000512.6-2217, mailed Jan. 3, 2005 (3 pages).

Search Report from the Danish Patent and Trademark Office for Singapore Patent Application No. 2004001 12-9, mailed Aug. 20, 2004 (7 pages).

Search Report for Singapore Application No. 200400111-1, issued on Jun. 5, 2004.

Translation of Office Action and Office Action for Japanese Patent Application No. 2004-248803 mailed Feb. 13, 2008, 7 pgs.

First Office Action for Chinese Application No. 200410001918.4, issued on Mar. 21, 2008, 9 pgs.

Search Report for European Patent Application No. 04000525.8, 4 pages, dated Jul. 27, 2006.

Examination Report for European Patent Application No. 04000525.8, 7 pages, dated Dec. 18, 2006.

English Translation of Examination Report for Japanese Patent Application No. 2004-008393, 3 pages, dated Dec. 6, 2006.

English Translation of Examination Report for Taiwanese Patent Aplication No. 93100919, 7 pages, dated Apr. 24, 2006.

Search Report for Singapore Patent Application No. 200400111-1, 6 pages, dated May 6, 2004.

Written Opinion for Singapore Patent Application No. 200400111-1, 10 pages, dated Jul. 11, 2005.

Examination Report for Singapore Patent Application No. 200400111-1, 10 pages, dated Mar. 24, 2006.

Office Action for Japanese Patent Publication No. 2004-248803 dated Sep. 28, 2007, 4 pages.

English abstract for Japanese Publication No. JP 2006-511069 T published Mar. 30, 2006, 1 pg.

English abstract for Japanese Patent Publication No. 2003-524175 T published Aug. 12, 2003, 1 page.

English abstract for Japanese Publication No. JP 58-16216 A published Jan. 29, 1983, 1 pg.

European Examination for Application No. 04000525.8-1226 mailed Feb. 13, 2009, 6 pgs.

Notice of Allowance mailed Apr. 1, 2005 for U.S. Appl. No. 10/688,923 filed Oct. 21, 2003, 7 pgs.

Non-Final Rejection mailed Feb. 28, 2005 for U.S. Appl. No. 11/183,847 filed Jul. 19, 2005, 8 pgs.

Notice of Allowance mailed Jul. 19, 2006 for U.S. Appl. No. 11/183,847 filed Jul. 19, 2005, 6 pgs.

Ex Parte Quayle Action mailed Oct. 22, 2004 for U.S. Appl. No. 10/753,557 filed Jan. 9, 2004, 6 pgs.

Notice of Allowance mailed Nov. 30, 2004 for U.S. Appl. No. 10/753,557 filed Jan. 9, 2004, 4 pgs.

Non-Final Rejection mailed Feb. 14, 2006 for U.S. Appl. No. 10/750,986 filed Jan. 5, 2004, 15 pgs.

Notice of Allowance mailed Oct. 19, 2006 for U.S. Appl. No. 10/750,986 filed Jan. 5, 2004, 8 pgs.

Notice of Allowance mailed Mar. 9, 2007 for U.S. Appl. No. 10/750,986 filed Jan. 5, 2004, 7 pgs.

Non-Final Rejection mailed Dec. 18, 2007 for U.S. Appl. No. 11/708,618 filed Feb. 21, 2007, 6 pgs.

Notice of Allowance mailed Aug. 15, 2005 for U.S. Appl. No. 10/651,049 filed Aug. 29, 2003, 9 pgs.

Notice of Allowance mailed Oct. 5, 2005 for U.S. Appl. No. 10/651,049 filed Aug. 29, 2003, 6 pgs.

Non-Final Rejection mailed Oct. 3, 2007 for U.S. Appl. No. 11/391,378 filed Mar. 29, 2006, 12 pgs.

Notice of Allowance mailed Apr. 4, 2008 for U.S. Appl. No. 11/391,378 filed Mar. 29, 2006, 8 pgs.

* cited by examiner

GRATING FOR EUV LITHOGRAPHIC SYSTEM ABERRATION MEASUREMENT

CROSS-REFERENCE TO RELATED APPLICATIONS

This application is a divisional of U.S. patent application Ser. No. 10/753,557, filed Jan. 9, 2004, entitled TAILORED REFLECTING DIFFRACTOR FOR EUV LITHOGRAPHIC SYSTEM ABERRATION MEASUREMENT, now U.S. Pat. No. 6,867,846 B2, issued Mar. 15, 2005, which in turn claims priority to U.S. Provisional Patent Application No. 60/440,051, filed Jan. 15, 2003, entitled TAILORED REFLECTING DIFFRACTOR FOR EUV LITHOGRAPHIC SYSTEM ABERRATION MEASUREMENT, which is incorporated by reference herein.

BACKGROUND OF THE INVENTION

1. Field of the Invention

The present invention is generally related to extreme ultraviolet (EUV) photolithography systems, and more particularly, to measuring wavefront parameters in a photolithographic system.

2. Related Art

Lithography is a process used to create features on the surface of substrates. Such substrates can include those used in the manufacture of flat panel displays, circuit boards, various integrated circuits, and the like. A frequently used substrate for such applications is a semiconductor wafer. One skilled in the relevant art would recognize that the description herein would also apply to other types of substrates.

During lithography, a wafer, which is disposed on a wafer stage (WS), is exposed to an image projected onto the surface of the wafer by an exposure system located within a lithography system. The exposure system includes a reticle (also called a mask) for projecting the image onto the wafer.

The reticle is generally located between a semiconductor chip and a light source, usually mounted on a reticle stage (RS). In photolithography, the reticle is used as a photo mask for printing a circuit on a semiconductor chip, for example. Lithography light shines through the mask and then through a series of optical lenses that shrink the image. This small image is then projected onto the silicon or semiconductor wafer. The process is similar to how a camera bends light to form an image on film. The light plays an integral role in the lithographic process. For example, in the manufacture of microprocessors (also known as computer chips), the key to creating more powerful microprocessors is the size of the light's wavelength. The shorter the wavelength, the more transistors can be etched onto the silicon wafer. A silicon wafer with many transistors results in a more powerful, faster microprocessor.

As chip manufacturers have been able to use shorter wavelengths of light, they have encountered a problem of the shorter wavelength light becoming absorbed by the glass lenses that are intended to focus the light. Due to the absorption of the shorter wavelength light, the light fails to reach the silicon wafer. As a result, no circuit pattern is created on the silicon wafer. In an attempt to overcome this problem, chip manufacturers developed a lithography process known as Extreme Ultraviolet Lithography (EUVL). In this process, a glass lens can be replaced by a mirror.

The problem of measuring the quality of the illumination beam is a persistent one for the lithographic applications. In particular, it is desirable to be able to measure wavefront quality in the photolithographic tool during wafer production and exposure, rather than having to disassemble the tool in order to do so. The particular environmental needs of an EUV Tool make disassembly a long and arduous task.

SUMMARY OF THE INVENTION

The present invention is directed to a grating for EUV lithographic system aberration measurement that substantially obviates one or more of the problems and disadvantages of the related art.

An embodiment of the present invention includes a grating with an absorptive substrate and a plurality of reflective lines on the absorptive substrate. Each reflective line is formed by a plurality of reflective areas. The reflective areas can be arranged in a regular pattern. The reflective areas are between 70 nm and 120 nm in diameter. The reflective areas can be circular. The reflective areas can have a random height distribution.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

Figure 1:
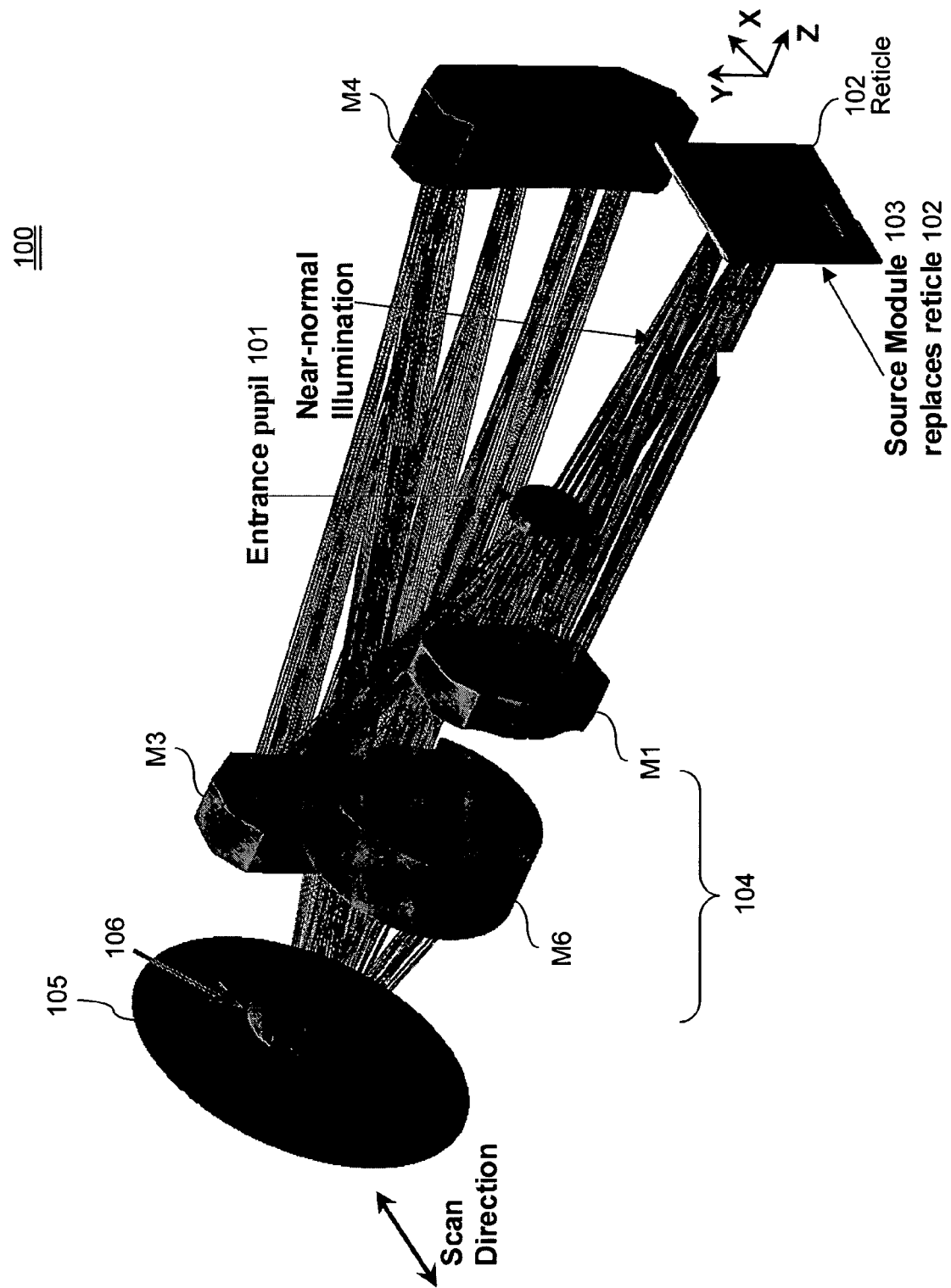
FIG. 1 shows a portion of an EUV photolithographic system.

FIG. 1 illustrates a portion of an EUV photolithographic system 100, which includes an EUV source (not shown in FIG. 1). The system 100 also includes image optics (including mirrors M4 and M3), a pupil 101, a reflective reticle 102 mounted on a reticle stage (RS, not shown) with an image of a pattern to be imaged onto a wafer 105, and projection optics (PO) 104 mirrors M1 and M6. The EUV radiation is then projected onto a wafer 105, which is mounted on a wafer stage (WS, not shown). It will be appreciated that the reticle 102 is reflective in EUV systems, unlike photolithographic systems operating at longer wavelengths, such as deep ultraviolet, or visible, where the reticle 102 is usually transmissive, although the invention is applicable to both types of reticles.

As further shown in FIG. 1, in the present invention, a sensor module 106 is placed on the wafer stage, and a source module 103 is placed on the reticle stage, to measure the wavefront. The sensor 106 and the source module 103 are collectively referred to as a wavefront sensor (WFS).

Figure 2:
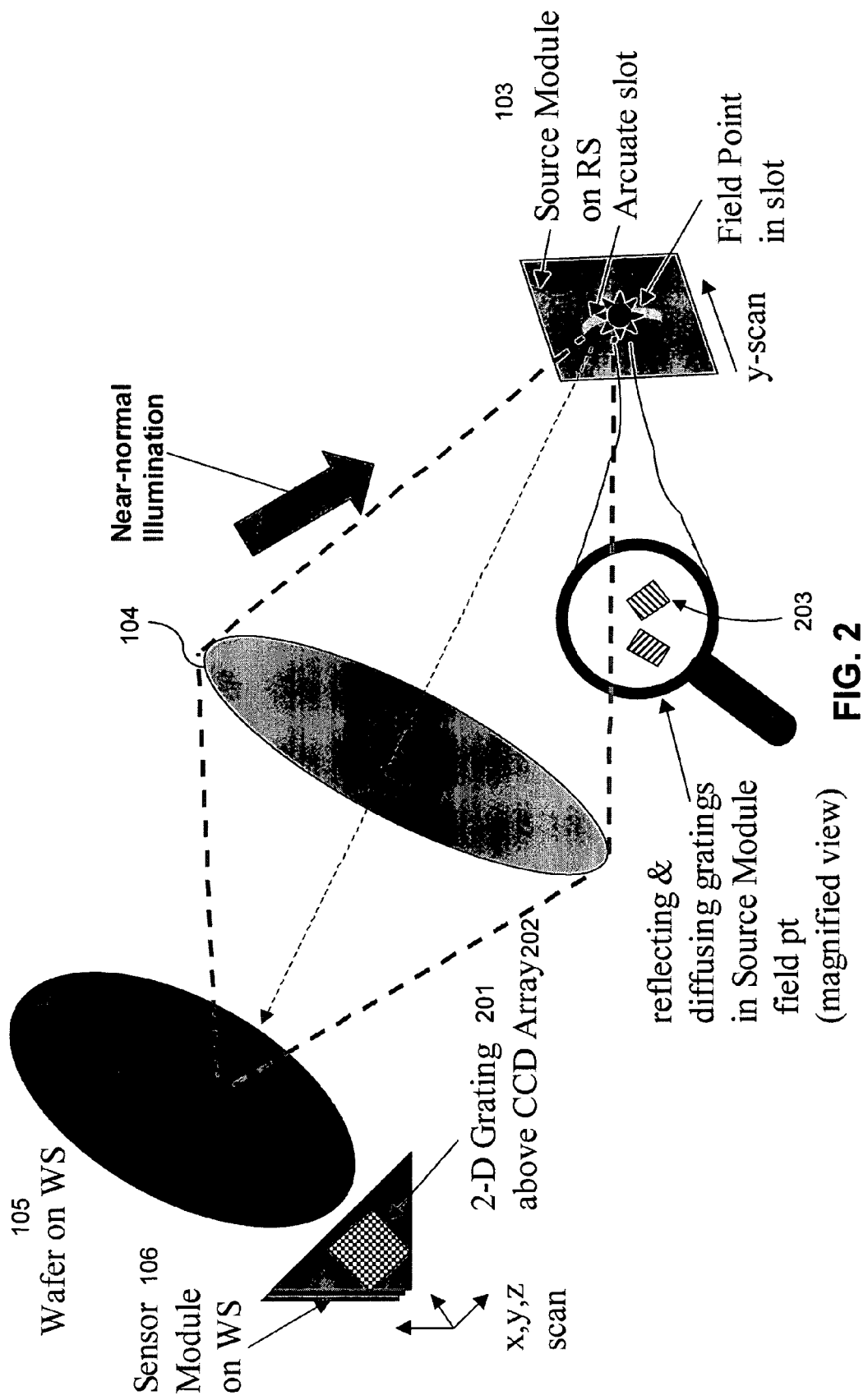
FIG. 2 shows an illustration of how a sensor module and a source module of the present invention fit within the photolithographic system.

FIG. 2 is another illustration of the wavefront measurement apparatus of the present invention, particularly as it can be incorporated into a photolithographic system. The source module 103 is placed on the reticle stage (not shown), and includes a linear source module grating 203. The wavefront sensor (or sensor module 106) is placed on the wafer stage (not shown) and includes a sensor module grating 201 (which may be a linear grating or a 2-D checkerboard grating) and a CCD detector 202 that is positioned below the sensor module grating 201. The projection optics (PO) 104 remain the same as during normal exposure operation, and are abstracted as a single element in FIG. 2 to simplify the figure.

The wavefront can be measured when imaging is not being performed. In order to measure the wavefront, the reticle stage is moved, such that one of the gratings 203 in the source module 103 on the reticle stage is placed in the optical path, rather than the reticle 102 itself. The wafer stage is also moved such that the wavefront sensor is positioned to receive an image of the source module grating 203. The CCD detector 202 below the sensor module grating 201 then detects the transmitted radiation. The reticle stage can then be moved to place a different diffraction grating in the optical path, so as to enable measurement of the wavefront with an orthogonal orientation of the source module grating 203.

The sensor module grating 201 includes both transmissive and opaque regions. The opaque regions can be formed of materials that absorb EUV radiation (this case, for 13.5 nm exposure wavelength), such as nickel, chromium or other metals.

One of ordinary skill in the art will also appreciate that some of the tolerancing concerns between the sensor module 106 and the source module 103 can be resolved by first fabricating the sensor module grating 201, measuring its exact dimensions, and then fabricating the source module grating 203 accordingly. This reduces the need for extreme precision in the manufacture of both sets of gratings simultaneously.

Figure 3A:
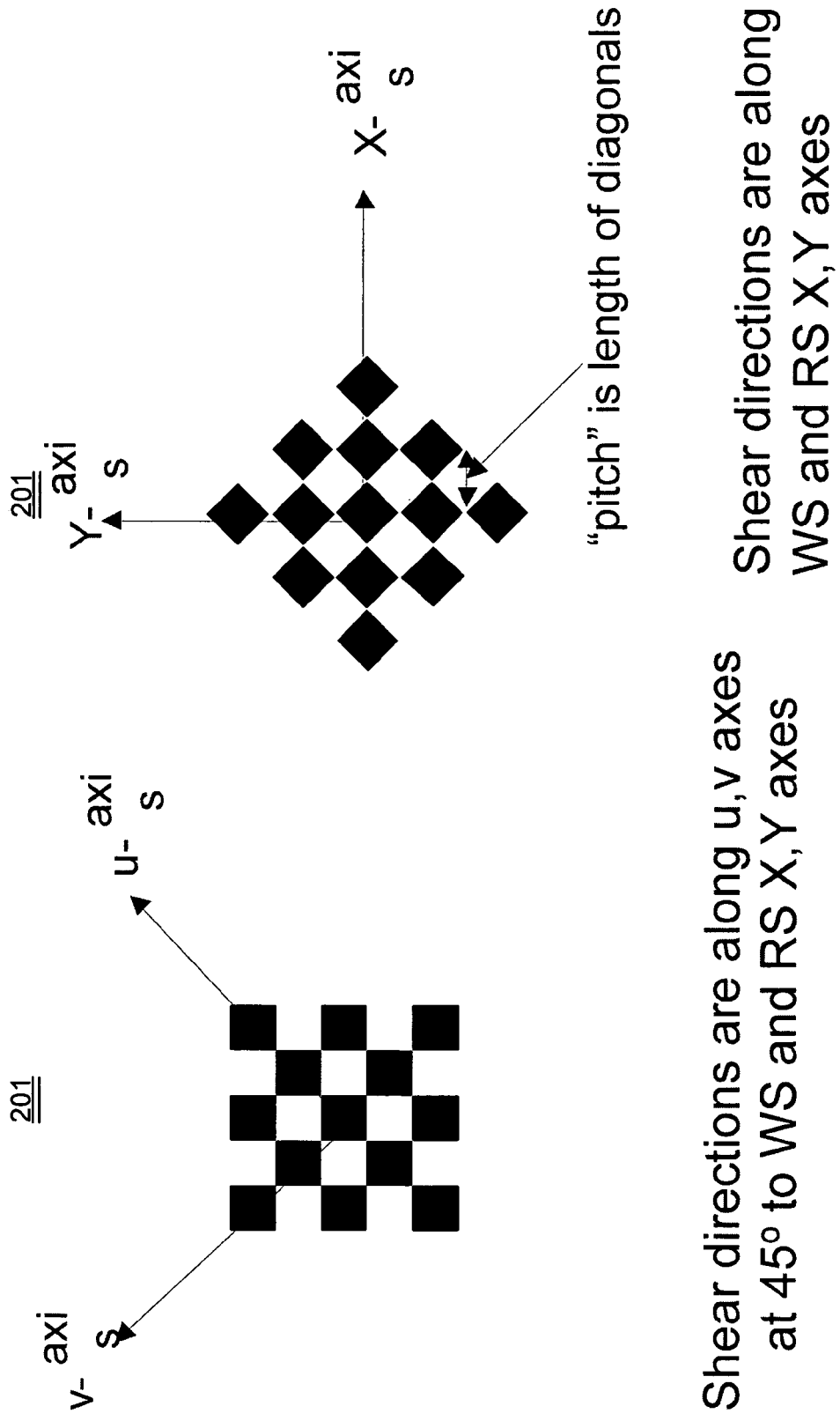
FIG. 3A shows an example of a 2-D checkerboard grating.

Another embodiment of the sensor module grating 201 is a cross grating, as shown in FIG. 3A, such that two linear gratings of an appropriate pitch are essentially placed one on top of another, with each grating having the appropriate pitch dimension to result in a wavefront shear equivalent to that of the checkerboard configuration. It is believed, however, that the checkerboard grating gives best results.

It will also be appreciated that although the discussion above is primarily in terms of an EUV photolithography system, where reflective optical elements are typically used (such as the source module grating 203, the projection optics 104, and the imaging optics), the invention is equally applicable to other wavelengths used in the photolithographic system, with appropriate transmissive/refractive components used in place of reflective ones, as appropriate.

The pitch of the source module grating 203 is also chosen to make interference between plus and minus first order images disappear.

Figure 3B:
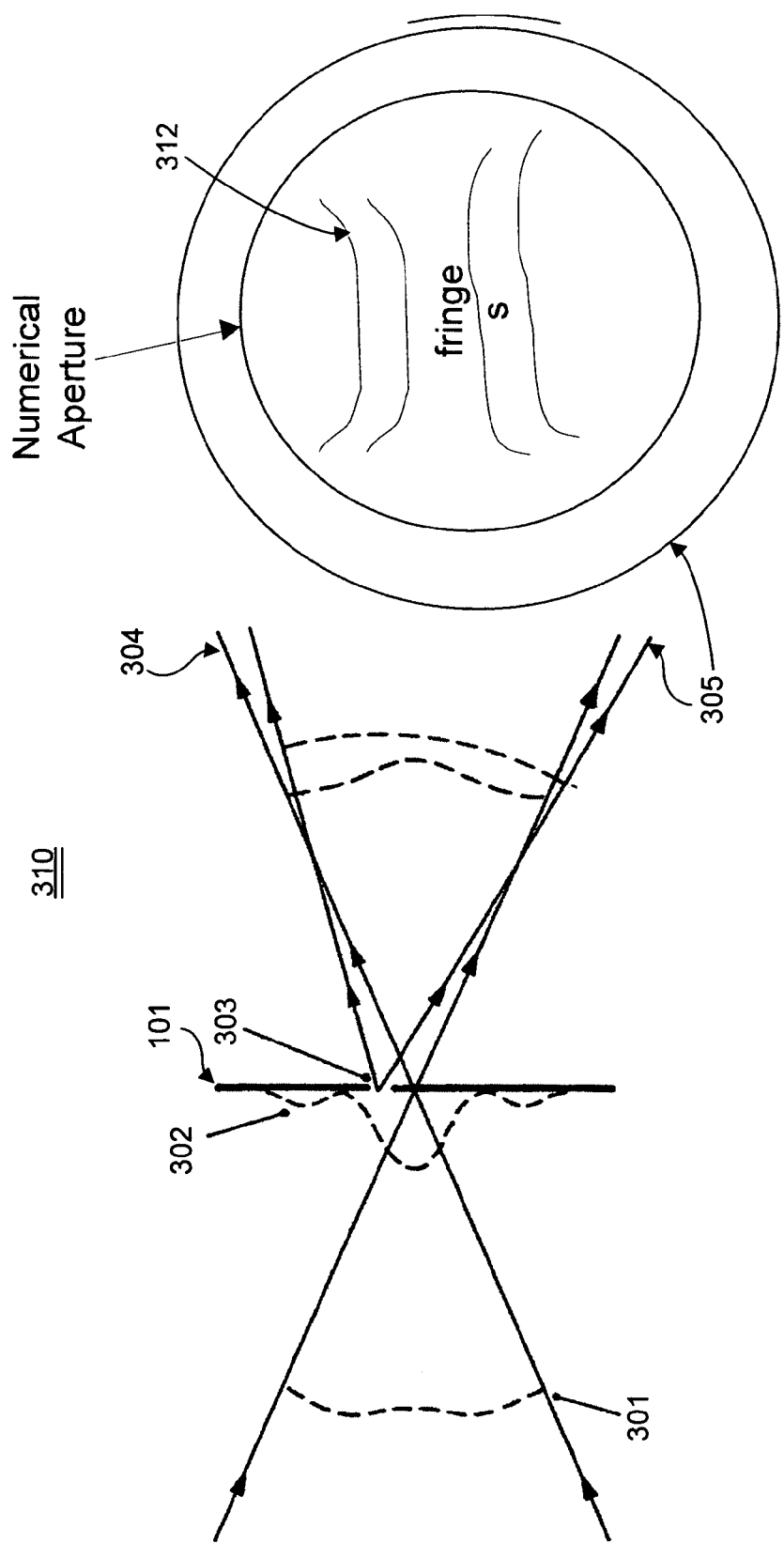
FIGS. 3B and 4 illustrate the use of an interferometer to produce shear wavefronts.
Figure 4:
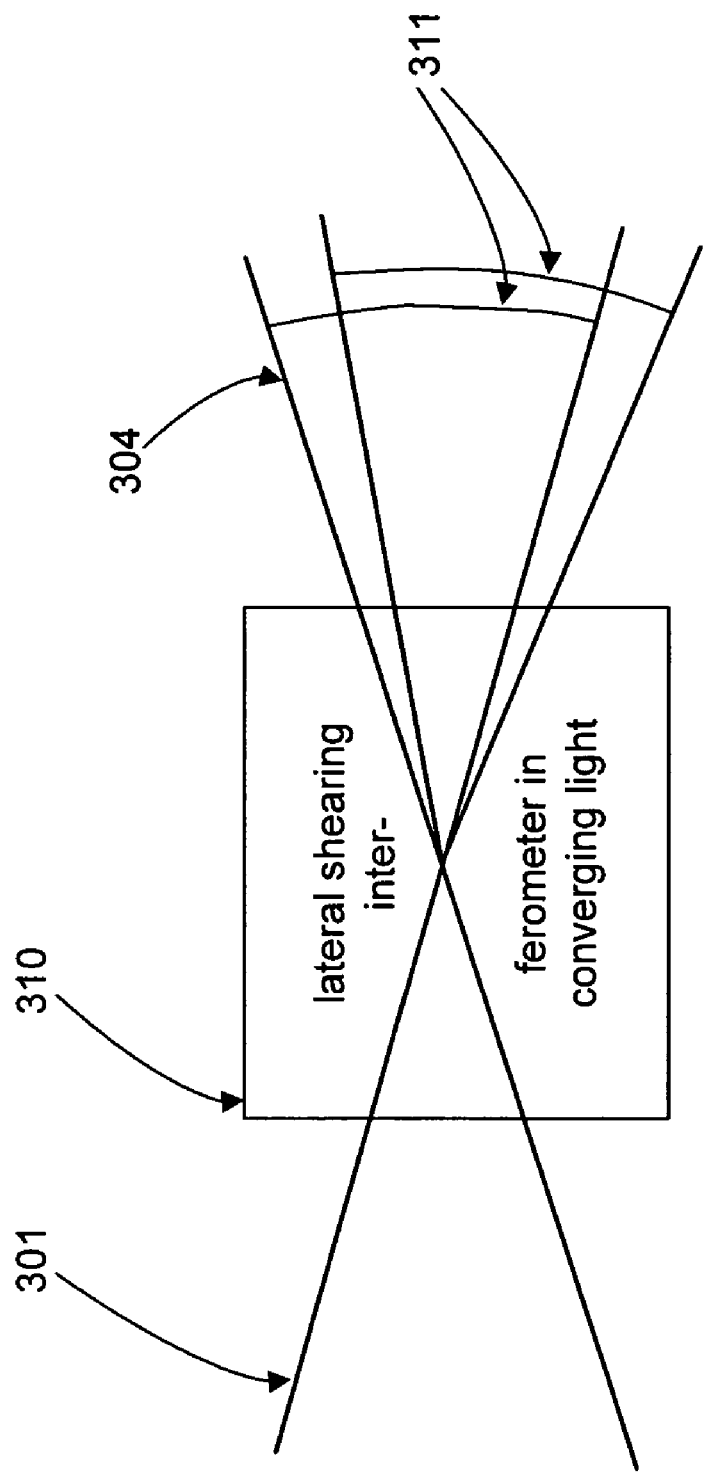

FIGS. 3B and 4 illustrate the use of a pupil in a lateral shearing interferometer 310 to produce reference wavefronts and shear wavefronts. (See also the entrance pupil 101 in FIG. 1). As shown in FIGS. 3B and 4, a wavefront 301 converges at a point in space, while emanating from a primary source. An image of a point source 302 exists at an entrance pupil 101. A partially transmitting film may be placed at the entrance pupil 101. A pinhole 303 is positioned at the entrance pupil 101. The pinhole 303 generates a transmitted wave 304 with a wavefront 311, which includes a diffracted spherical reference wave 305. Thus, the lateral shearing interferometer 310 creates one or more apparent sources, whose wavefronts 311 interfere to produce fringes 312.

Figure 5:
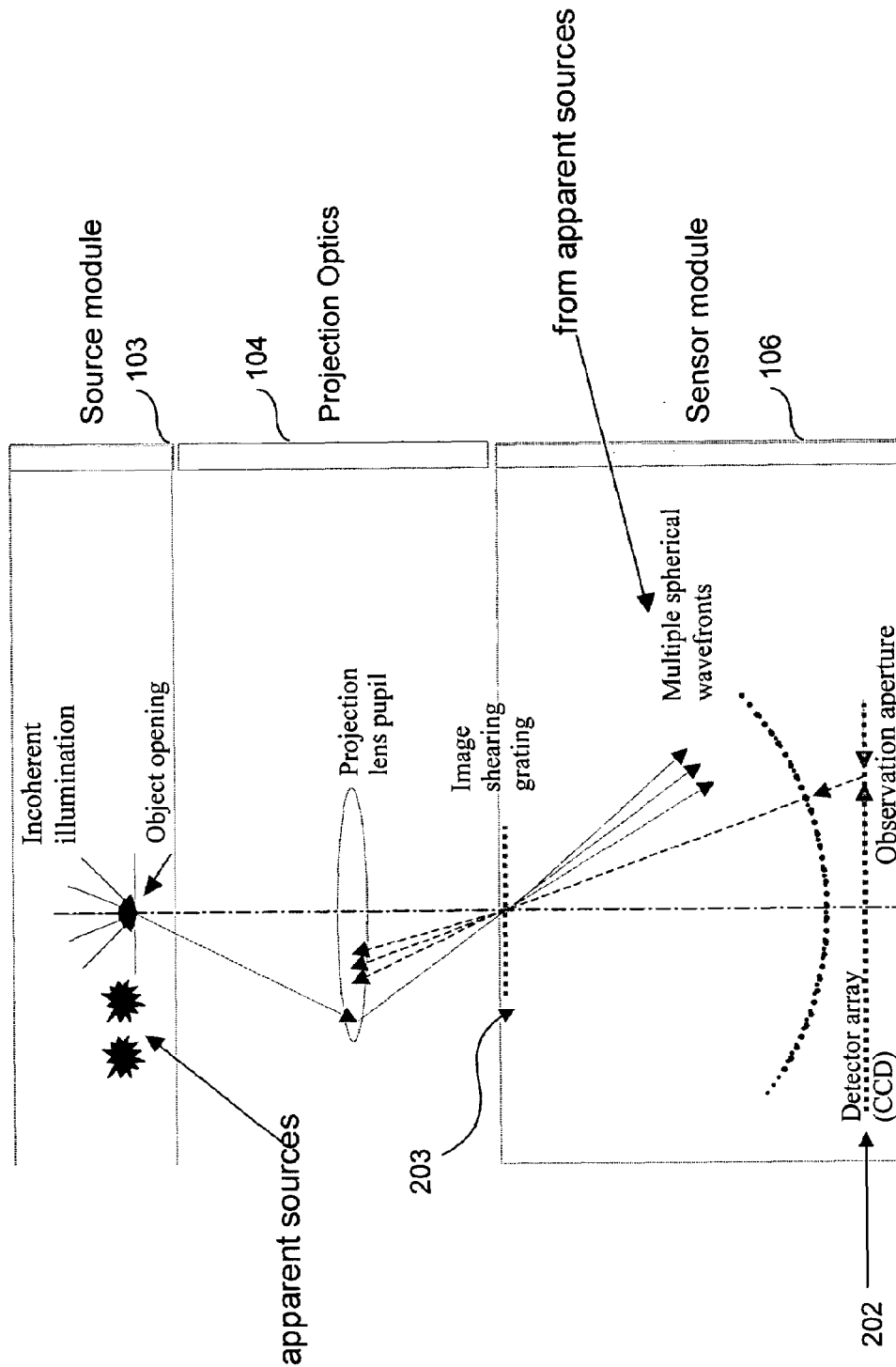
FIG. 5 is another schematic illustrating the present invention as used within a photolithographic tool.

FIG. 5 is another illustration of the wavefront measurement system of the present invention, showing the source module 103 positioned in the object plane (reticle 102 plane, not labeled in the figures) and the projection optics 104. An image shearing grating 203 is positioned on the reticle stage, and generates multiple wavefronts that are then detected in the sensor module 106.

Figure 6:
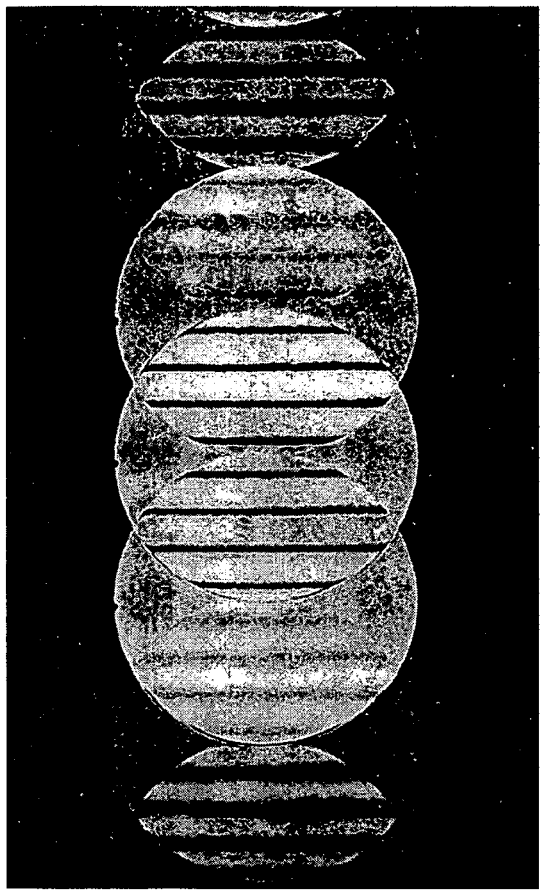
FIGS. 6-11 illustrate examples of interference fringes seen at the focal plane with the use of the present invention.
Figure 6:
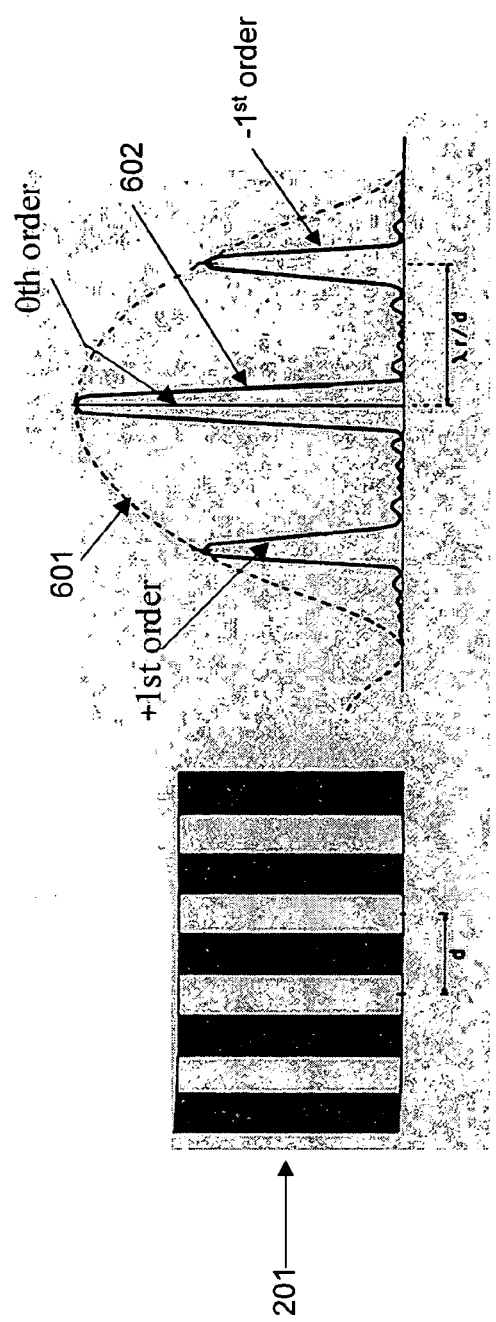

FIG. 6 illustrates the wavefront fringes (312 in FIG. 3B) as seen by the CCD detector 202. As shown in FIG. 6, in the upper right-hand photograph, sheared fringes for a single object space slit are shown, where the slit is positioned in front of an incoherent, diffuse source that fills the maximum numerical aperture and smoothes any wavefront inhomogeneities. The bottom right-hand figure shows a single fringe visibility function 601, with zeroth order and first order diffraction patterns 602. The 50% duty cycle on the grating 203 makes all even orders of the diffraction pattern invisible. At the bottom left of FIG. 6, the image space shearing grating 201 is shown, with a shear ratio of 0.5.

Figure 7:
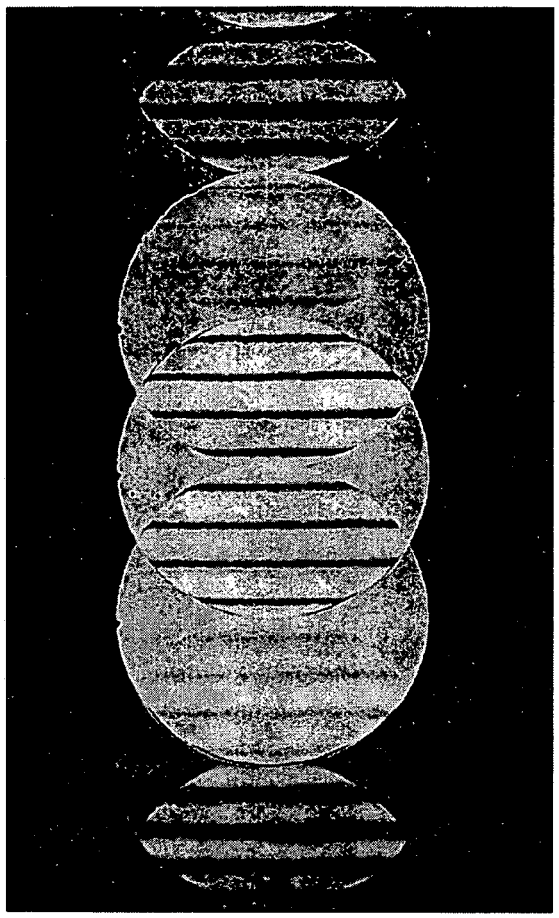
Figure 7:
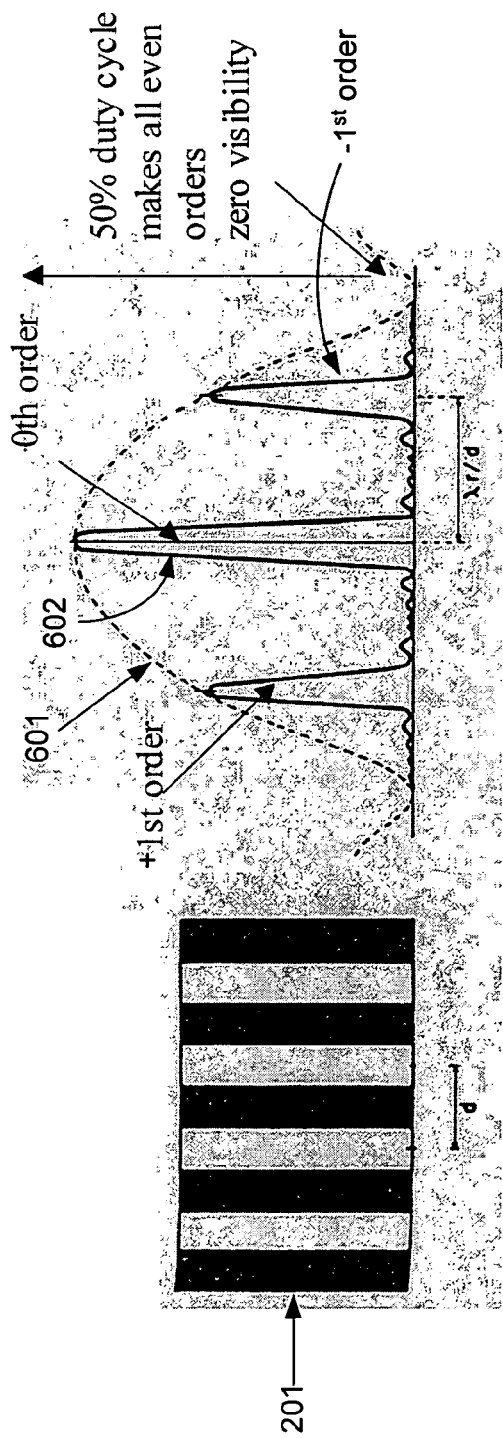
Figure 8:
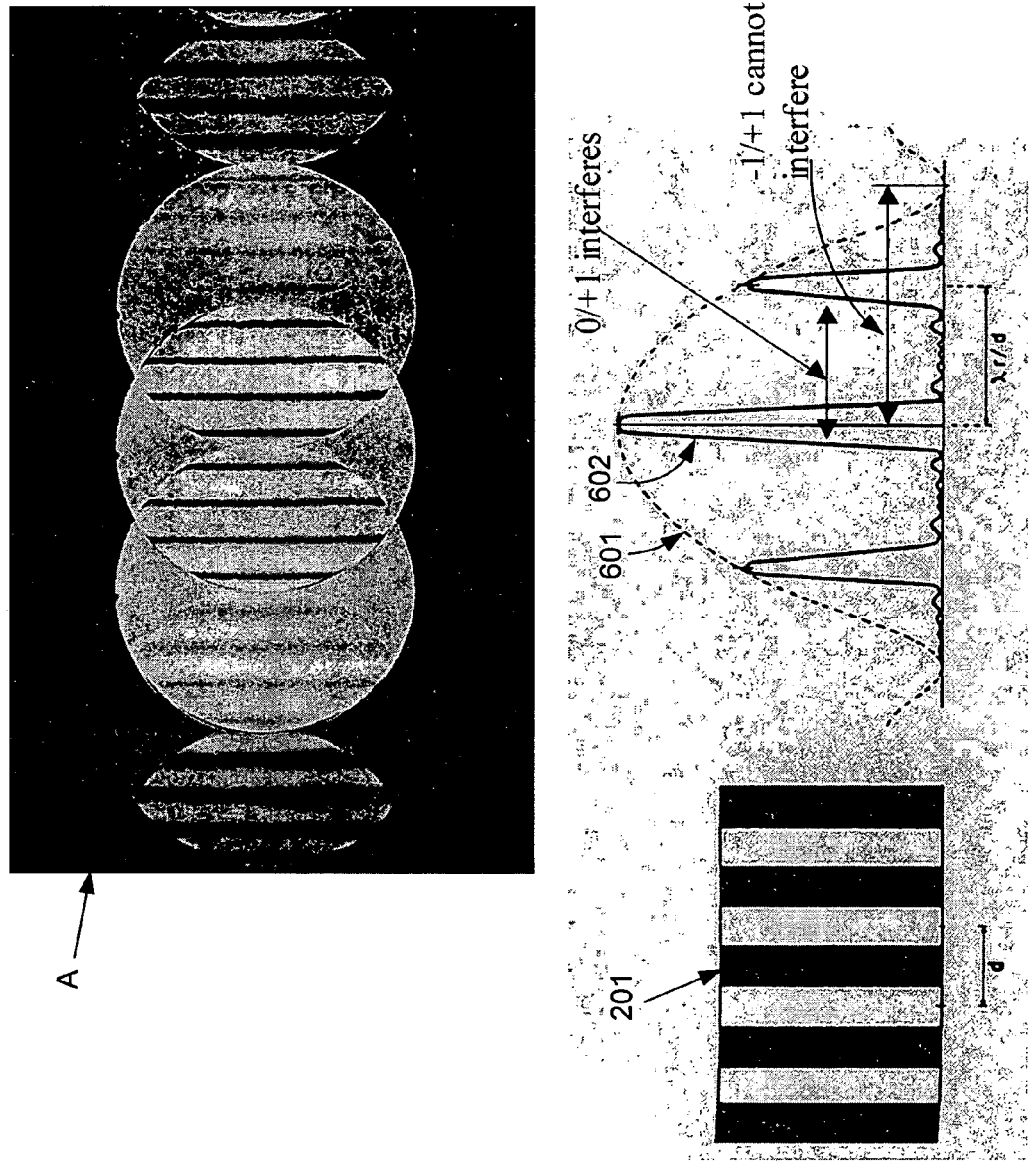
Figure 9:
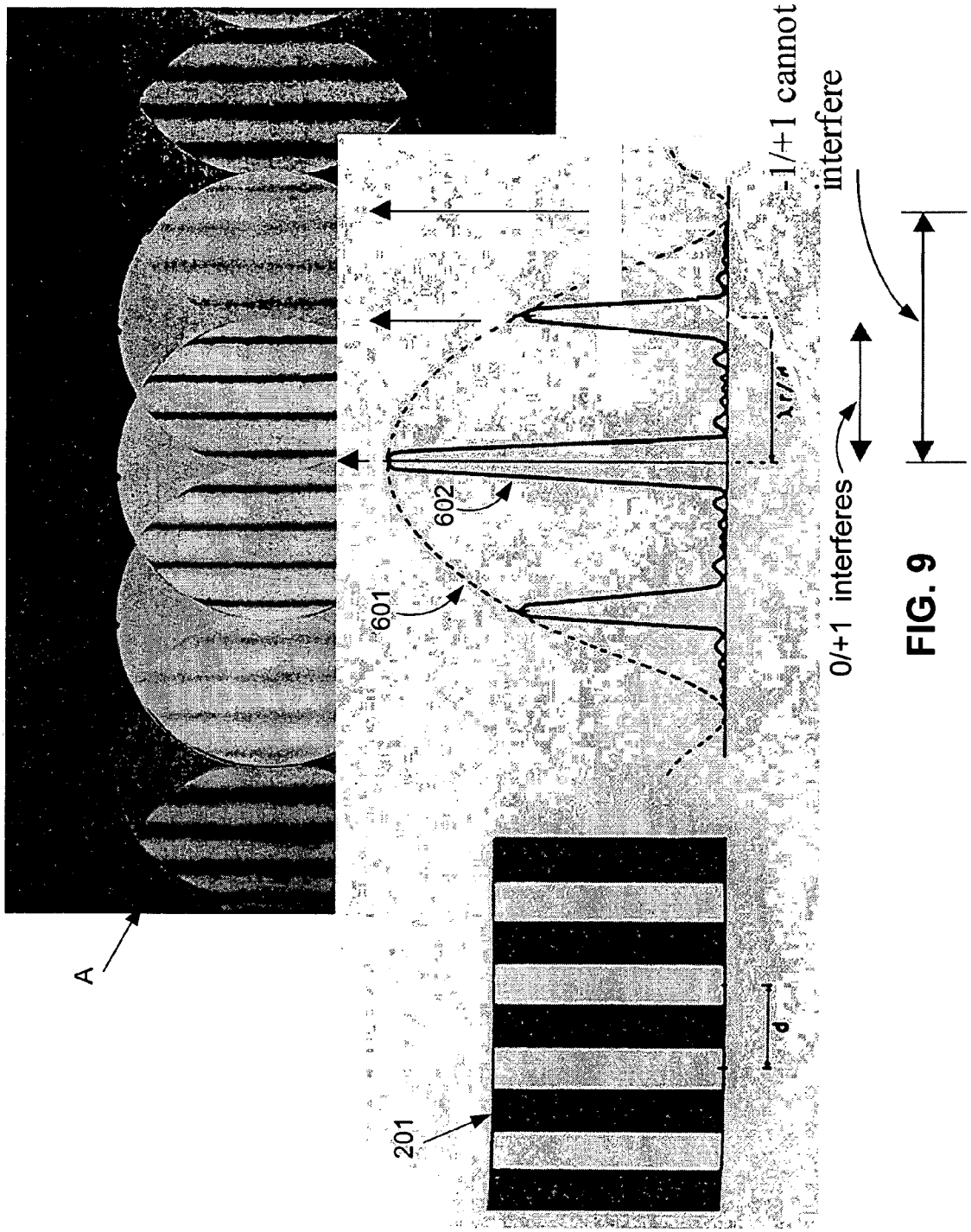

FIGS. 7-11 illustrate the wavefronts as seen by the CCD detector 202, for different shear ratios. In these figures, A designates the fringes seen at the detector, 601 designates the fringe visibility function (for a single slit), and 602 designates the fringe visibility function (for multiple slits). In FIG. 7, the shear ratio is 0.5.

Figure 10:
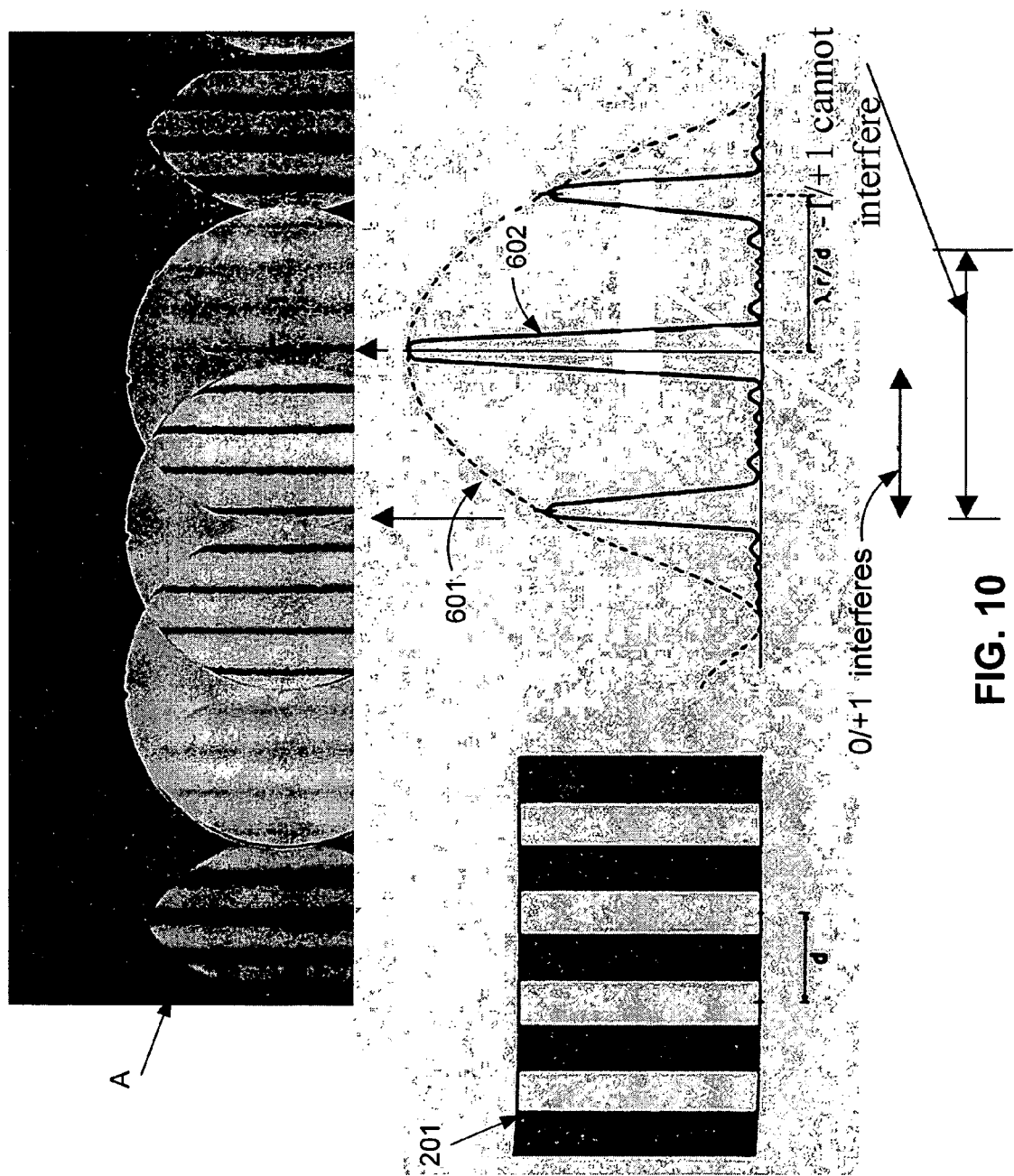
Figure 11:
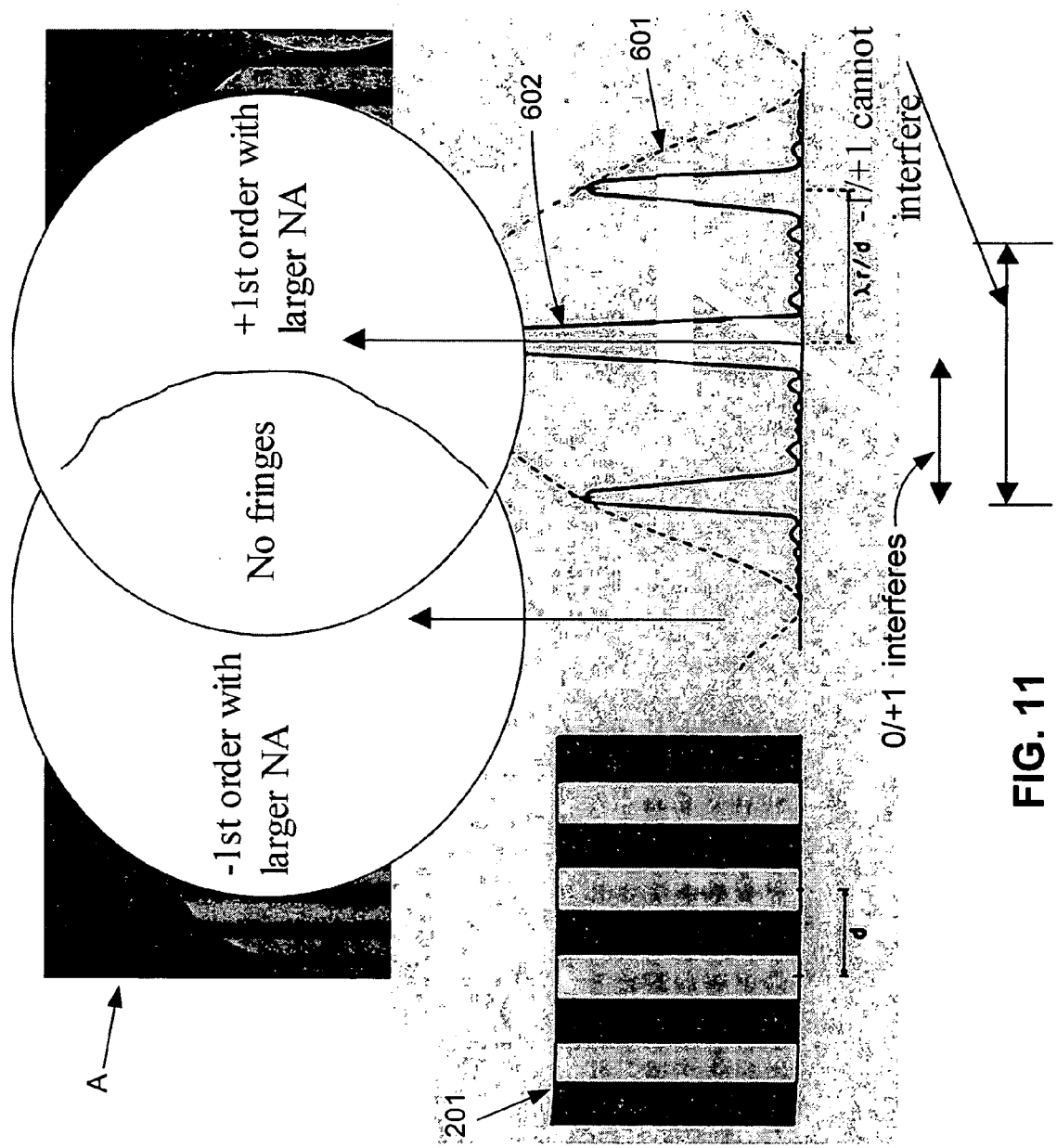

With further reference to FIGS. 1 and 10, the wavefront can be further analyzed by taking a number of images N at the CCD detector 202 while scanning the reticle stage by linewidth/N at a time. For a 6.4 micron pitch of the grating 203, and 16 images, the reticle stage is scanned by 6.4 microns/16=400 nm at a time. The images may then be combined to produce a better analysis than would be available from a single image.

A particular problem that frequently exists in many EUV photolithographic systems is that the EUV source does not provide uniform illumination intensity, but instead has a number of facets, or hot spots, that result from use of fly's eye lenses in the optics of the EUV source. This results in a non-uniform wavefront at the input NA pupil of the PO 104, or sometimes, in underfilled numerical aperture (NA) of the PO. For example, the particular system of one embodiment of the present invention has an input numerical aperture of 0.0625 for the projection optics 104, and an output numerical aperture of 0.25. Thus, it is desirable to be able to eliminate the underfilling and intensity nonuniformity at the input NA of the PO 104. Note that the problems discussed above affect the measurement of the wavefront by the wavefront sensor discussed above.

Figure 12:
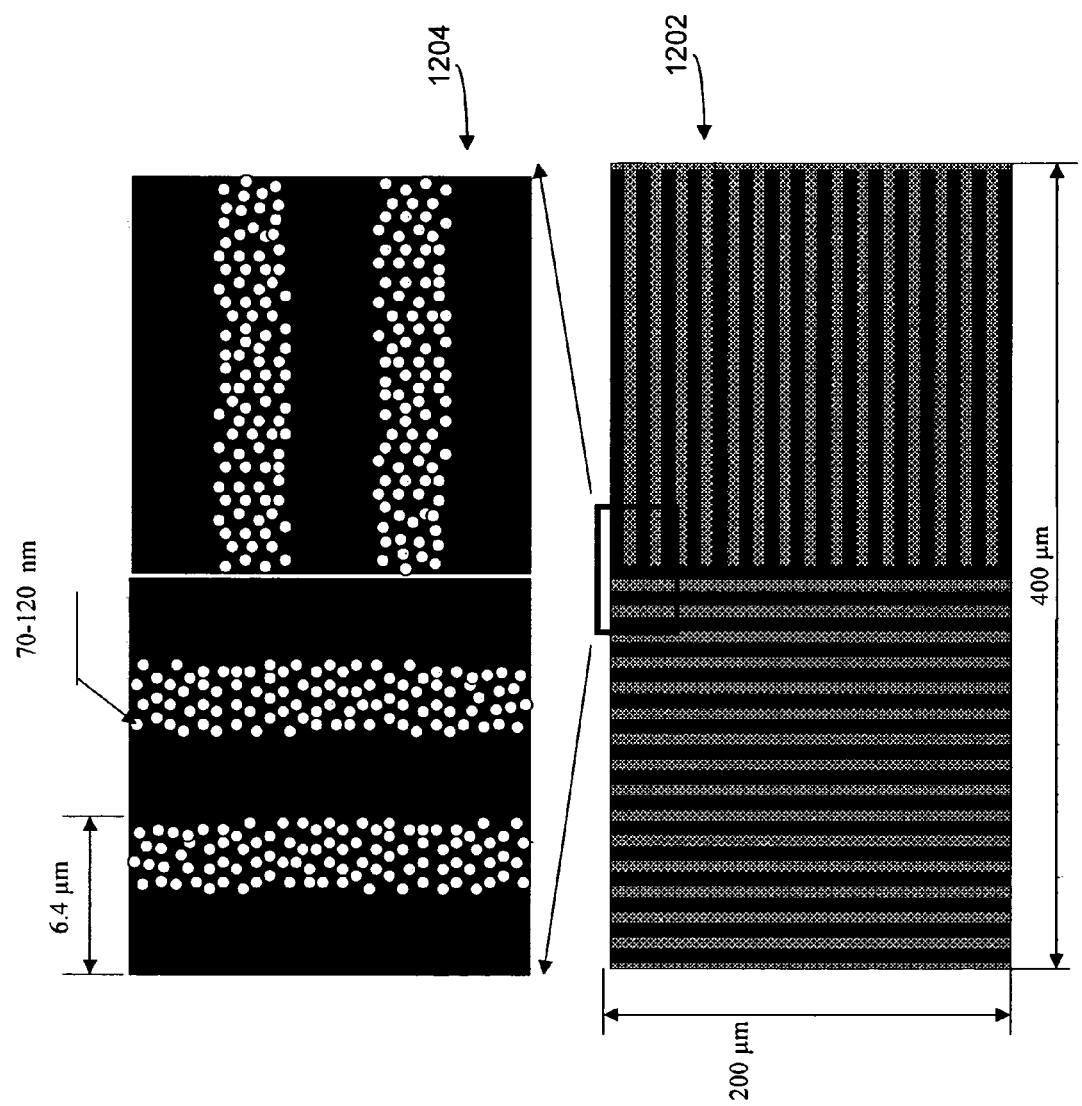
FIG. 12 illustrates one embodiment of a source module grating using a random pattern of reflecting dots.

FIG. 12 illustrates one proposed solution for overcoming these problems. As shown in FIG. 12, which illustrates one type of a linear grating, each reflecting line of the grating is formed not of a continuous reflecting stripe (or line), but instead of a plurality of reflecting dots. The reflecting dots can be randomly scattered, as shown in FIG. 12, or can be arranged in a regular matrix pattern. Thus, as may be seen from FIG. 12, the lines of the grating 1202 of the source module, when seen "from far away," appear to be solid lines, as discussed above. However, when viewed "up close" (as illustrated at 1204), they are instead made up of a number of reflecting dots. The remainder of the material, for EUV application, would be absorbing.

The grating lines are chosen as already stated to have a direct relation to the $2^{nd}$ grating lines so as to further maximize the use of the object plane illumination, preserve fringe visibility at the detector, and eliminate + and −1 order fringes.

In one embodiment, the diameter of the dots, for the parameters discussed above (6.4 μm for 4× magnification, 0.25 output NA, 0.0625 input NA, 13.5 nm source) is between 70 and 120 nm, preferably close to 70 nm.

The bottom portion of FIG. 12 shows the overall arrangement of two orthogonally oriented gratings that collectively form the source module grating 203 of the present invention. As may be seen in the bottom portion of FIG. 12, the reflecting dots can be arranged in two adjacent orthogonal patterns, each approximately 200 μm by 200 μm.

It will be appreciated that with the use of the reflecting dots of the present invention, the single diffraction pattern, as shown in FIG. 10, for example, becomes a diffraction pattern within a diffraction pattern. Thus, each reflecting dot becomes a wavefront source, as viewed from the focal plane. Therefore, irregularities in intensity, particularly due to fly's eye facets of the source, will disappear, presenting a clean, regular image of the source at the focal plane. The reflecting dot pattern of the grating 203 also has the advantage that it overfills the 0.0625 NA of the projection optics, and utilizes as much light that is incident onto the grating 203 as possible. Furthermore, no additional pupil facets or pupil structure is introduced if illumination is spatially incoherent. The reflecting dot grating shown in FIG. 12 can be fabricated on a standard reticle blank. The dot diameter is preferably chosen to more than overfill the numerical aperture, so as to provide near-uniform pupil illumination.

When the dots are placed randomly within the grating lines, speckle appears in the fringe pattern, and a bright spot in the center of the diffraction pattern also appears. The bright center can be eliminated by making the dots of random height, with a standard deviation of many times a wavelength (i.e., an optical path difference of many times π plus a fraction). When the dots are placed in a regular pattern, the overlapping fringe artifacts in the fringe plane can also be eliminated by making the dots of random height with an optical path difference standard deviation of many times π (but at the price of causing speckle). However, the fringe artifacts may have less impact on fringe analysis.

Additionally, a factor of 2 drop-off in intensity can be allowable for each dot, since photon noise-limited elemental detection signal-to-noise ratio increases only by the square root of two. Note also that larger diameters can be desirable due to manufacturability issues. Calculations show that a 44 nm diameter dot gives a 10% drop-off, a 66 nm diameter dot gives a 20% drop-off, and a 112 nm diameter dot gives a 50% drop-off, for example.

Thus, the reflecting dot grating 203 of the present invention is an example of a reflective EUV scattering device, that in this case has 0.4% efficiency for the large number of dots and first grating size, with an additional goal of maximizing the efficiency. Efficiency here is defined as the fraction of the illumination power falling within the desired numerical aperture after reflection from the device, as compared to a Lambertian diffuser.

Figure 13:
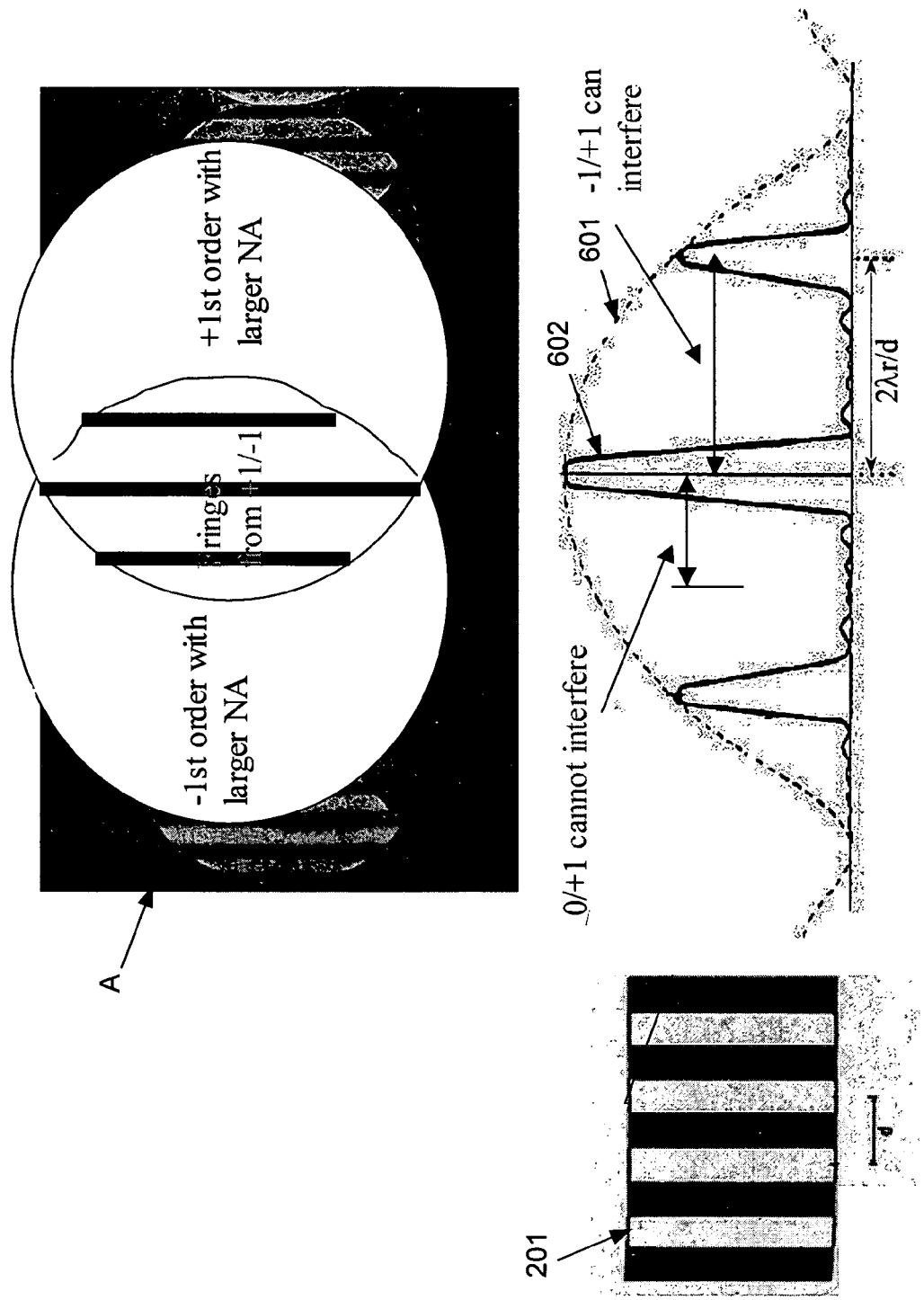
FIG. 13 illustrates an example of interference fringes seen at the focal plane with the use of the reflecting dots of the present invention.

FIG. 13 illustrates an example of interference fringes seen at the focal plane with the use of the reflecting dots of the present invention. FIG. 13 is generally similar in nature to FIGS. 6-11. The object space grating has a pitch of 433 the pitch of image space grating in FIG. 13. Also, 601 refers to a single slit coherence function, and 602 refers to a multiple slit coherence function.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A grating used for measuring a wavefront in a lithographic system, comprising:
   an absorptive substrate; and
   a plurality of reflective lines on the absorptive substrate, each reflective line formed by a plurality of reflective areas, the reflective areas arranged in a regular patterns,
   wherein a pitch of the grating is chosen to substantially eliminate interference between plus and minus first order images.

2. The grating of claim 1, wherein the reflective areas are between 70 nm and 120 nm in diameter.

3. The grating of claim 1, wherein the reflective areas are circular.

4. The grating of claim 1, wherein the reflective areas have a random height distribution.

5. The grating of claim 1, wherein the regular pattern is a matrix pattern.

6. The grating of claim 1, wherein the grating is configured to measure a quality parameter of the wavefront in the lithographic system.

7. The grating of claim 6, wherein the grating is configured to measure the quality parameter of the wavefront during wafer production.

8. The grating of claim 6, wherein the grating is configured to measure the quality parameter of the wavefront when imaging is not being performed.

9. A grating used for measuring a wavefront in a lithographic system, comprising:
   a substrate; and
   a plurality of reflective lines on the substrate, each reflective line formed by a plurality of reflective areas, the reflective areas arranged in a matrix pattern,
   wherein a pitch of the grating is chosen to substantially eliminate interference between plus and minus first order images.

10. The grating of claim 9, wherein the reflective areas are between 70 nm and 120 nm in diameter.

11. The grating of claim 9, wherein the reflective areas are circular.

12. The grating of claim 9, wherein the reflective areas have a random height distribution.

13. The grating of claim 9, wherein the substrate is absorptive.

14. A grating used for measuring a wavefront in a lithographic system, comprising:
   a substrate; and a plurality of reflective lines on the substrate, each reflective line formed by a plurality of reflective areas, the reflective areas having a random height distribution, wherein a pitch of the grating is chosen to substantially eliminate interference between plus and minus first order images.

15. The grating of claim 14, wherein the reflective areas are between 70 nm and 120 nm in diameter.

16. The grating of claim 14, wherein the reflective areas are circular.

17. The grating of claim 14, wherein the substrate is absorptive.

18. The grating of claim 14, wherein the reflective areas are arranged in a regular pattern.

19. The grating of claim 14, wherein the reflective areas are arranged in a matrix pattern.

20. The grating of claim 14, wherein the reflective areas are arranged in a random pattern.

* * * * *